United States Patent [19]

Sherman

[11] Patent Number: 5,212,783
[45] Date of Patent: May 18, 1993

[54] SYSTEM WHICH DIRECTIONALLY SUMS SIGNALS FOR IDENTIFYING AND RESOLVING TIMING INCONSISTENCIES

[75] Inventor: Steven K. Sherman, Marlboro, Mass.

[73] Assignee: Digital Equipment Corporation, Maynard, Mass.

[21] Appl. No.: 205,811

[22] Filed: Jun. 13, 1988

[51] Int. Cl.$^5$ .............................................. G06F 7/122
[52] U.S. Cl. ..................... 395/550; 364/950.5; 364/945.8; 364/945.9; 364/950; 364/DIG. 2
[58] Field of Search ... 364/200 MS File, 900 MS File, 364/569; 370/85.7, 85.12, 85.5; 395/550, 500

[56] References Cited

U.S. PATENT DOCUMENTS

| | | | |
|---|---|---|---|
| 3,663,174 | 1/1972 | Griffin | 371/28 |
| 3,969,703 | 7/1976 | Kwiatowski | 364/900 |
| 4,129,901 | 12/1978 | Masuda | 364/900 |
| 4,161,787 | 7/1979 | Groves | 364/900 |
| 4,263,651 | 4/1981 | Donath | 364/490 |
| 4,398,085 | 8/1983 | Benedict | 364/900 |
| 4,463,416 | 7/1984 | Wood | 364/900 |
| 4,527,249 | 7/1985 | Van Brunt | 364/578 |
| 4,566,062 | 1/1986 | Ohnishi | 364/200 |
| 4,663,704 | 5/1987 | Jones | 364/188 |
| 4,700,321 | 10/1987 | Ward | 364/474.12 |
| 4,791,593 | 12/1988 | Hennion | 364/578 |
| 4,868,739 | 9/1989 | Ngai | 364/200 |
| 4,924,430 | 5/1990 | Zasio | 364/578 |

Primary Examiner—Thomas C. Lee
Assistant Examiner—Eric Coleman
Attorney, Agent, or Firm—Cesari and McKenna

[57] ABSTRACT

Method and means for storing and analyzing timing information for electronic components and systems. Timing intervals and state transitions are represented as the edges and vertices, respectively, of a graph. Timing inconsistencies are detected where graph edges form a closed loop, and the sum of the values of the edges around the loop (taking account of path direction and interval signs) is non-zero. After identifying timing inconsistencies, the invention indicates which, if any, timing dependences are eligible for adjustment to bring the edge sum to zero and thereby alleviate the inconsistency.

14 Claims, 12 Drawing Sheets

SYSTEM WHICH DIRECTIONALLY SUMS SIGNALS FOR IDENTIFYING AND RESOLVING TIMING INCONSISTENCIES

BRIEF SUMMARY OF THE INVENTION

This invention relates to the design of complex operations such as those encountered in developing computers, and more particularly to assisting in the resolution of timing problems in such designs.

The design of a complex operation such as a read operation of a computer involves a number of interrelated timing specifications—200 specifications might be considered typical. Some of these specifications arise from hardware limitations such as requiring that a stable input signal to a device be established for a certain minimum time interval before a stable output signal is achieved; others arise from system requirements such as design cycle or operation time. Especially as such specifications relating to an operation become more numerous, it can be very difficult for a designer by inspection or analysis to tell whether a given aggregate of specifications is internally consistent, and if not where the trouble is. Frequently timing problems have been worked out only by simulation of the operation or by building and exercising a prototype, both rather expensive procedures.

It is a frequent practice in analyzing the timing of computer operations to define a sequence pattern giving a sequence of states for each of several electrical points of the hardware system. The sequence pattern of an operation provides a suitable framework for a systematic description its timing requirements. The particular set of states recognized in the analysis may include, in addition to the high voltage and low voltage states used for data signals, states indicating the electrical point is indeterminate or changing, but the particular set of states is not relevant to the present invention. The sequence for a particular electrical point may be denominated the signal of the electrical point, and a signal will thus be a sequence of states with each boundary between succeeding states denominated a transition. The aggregate of the signals may be denominated a sequence pattern. When a sequence pattern is presented against a time base common to all signals it is denominated a timing pattern.

According to the invention, timing specifications are formulated in terms of a set of dependences, D. Each dependence includes identification data specifying a first and a second transition, specification of a time interval between these transitions, a comparison parameter indicating whether said time interval is a MAXIMUM or a MINIMUM, and data characterizing the dependence as belonging to one of several classes with differing priorities. From the set of dependences, a set of of time attributes is calculated, one time attribute corresponding to each one of said identified transitions, said set T of time attributes, T, being such that for each of said FORCE class dependences in D, the difference between the time attribute of its first transition and the time attribute of its second transition is equal to the time interval specified for the dependence; for each of said dependences in D of class ATTEMPT or class CHECK, the difference between the time attribute of its first transition and the time attribute of its second transition either is equal to the time interval specified for the dependence or is compatible with the time interval and comparison parameter specified for the dependence; and the number of ATTEMPT class dependences in D for which the difference between the time attribute of its first transition and the time attribute of its second transition is equal to the time interval specified for the dependence is a maximized. Alternatively, if such set T of time attributes does not exist, a report that such set T of time attributes does not exist is generated.

DETAILED DESCRIPTION OF THE PREFERRED EMBODIMENT

Figure 1:
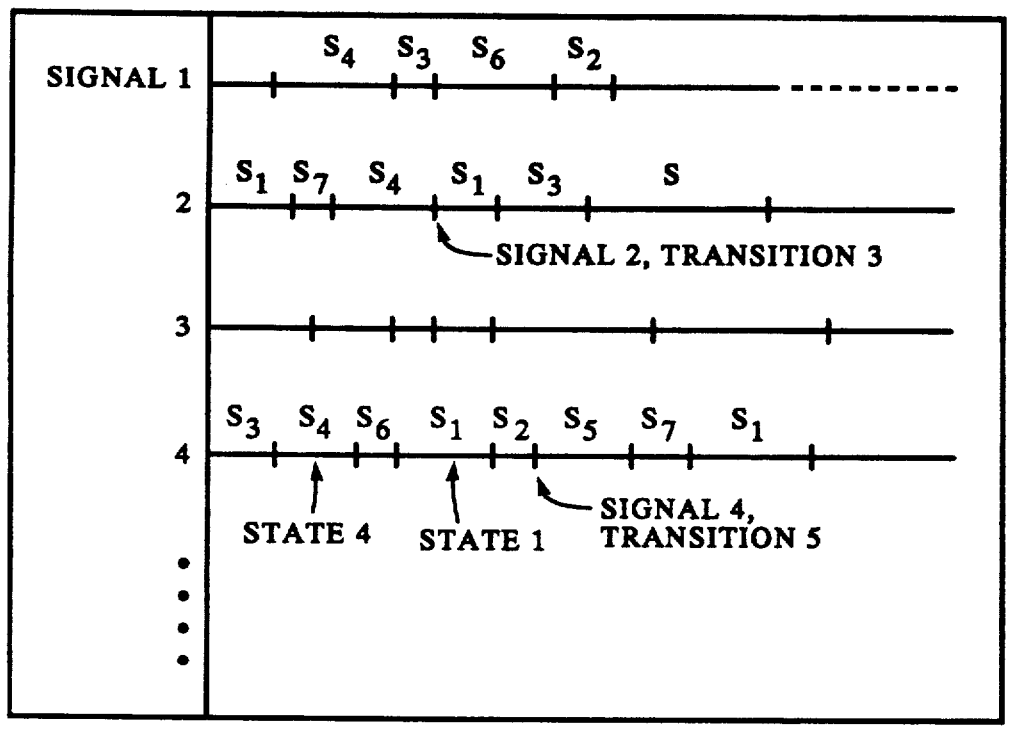
FIG. 1 shows an archetypal sequence pattern such as may be used to define dependences used in the invention.

As indicated above, the timing requirements of an operation are expressed in terms of dependences. Dependences may be conveniently defined with reference to a sequence pattern. Each transition of a sequence pattern can be identified by giving a serial number to its signal and then giving the ordinal number of the transition along the signal. An archetypal sequence pattern is shown in FIG. 1. A dependence is then identified by giving the serial numbers of the transitions which define the dependence. For example, Signal 3, 4th transition might be expressed as "signal 3-4".

In addition to identifying its bounding transitions, each dependence specifies a time interval from its first to its second bounding transitions (which may have positive or negative value), a characterization of the dependence as a FORCE class or ATTEMPT class or CHECK class, and a comparison parameter indicating whether said time interval is a MAXIMUM or a MINIMUM. For example the dependence "tSPEC" would be specified thus:

tSPEC:min, +13,signal2-5,signal22-14, attempt.

All the timing requirements of an operation under analysis are expressed by a set (denominated D) of dependences such as that exemplified. The comparison parameter in the dependence readily accommodates the usual practice of specifying components in terms of maximum and/or minimum values. The classes permit the analyst to factor in his views as to the relative flexibility of the various specifications. In general terms, the analyst can indicate by assignment of FORCE to a dependence that a specified interval be maintained, while by assigning an ATTEMPT he indicates that a deviation from the specified interval is tolerable if in the direction compatible with the comparison parameter, and by assigning a CHECK that a deviation in the direction compatible with the comparison parameter is acceptable.

The practice of the invention is most appropriate and advantageous when the members of the set of dependences are not fewer than 20; a typical number of dependences may be 200, and any greater number may be processed with increasing computer resources.

In the preparation of the set D the treatment of the transitions on a single signal, called sequence timing, require special mention. In principle, each pair of contiguous transitions on a given signal can be considered as giving rise to a dependence, namely that the interval from an earlier to a later transition should not be negative. In realistic situations, a designer will put forward a provisional design in which the sequence timing gives rise to very few or no inconsistencies. The direct sequence dependences may accordingly be excluded from the set D with little or no impact on the search for more subtle inconsistencies but with considerable expedition of the calculations because fewer dependences are processed. Since the possibility that a sequence is involved in an inconsistency, a check of this point is made subsequently to the main calculation.

Figure 2:
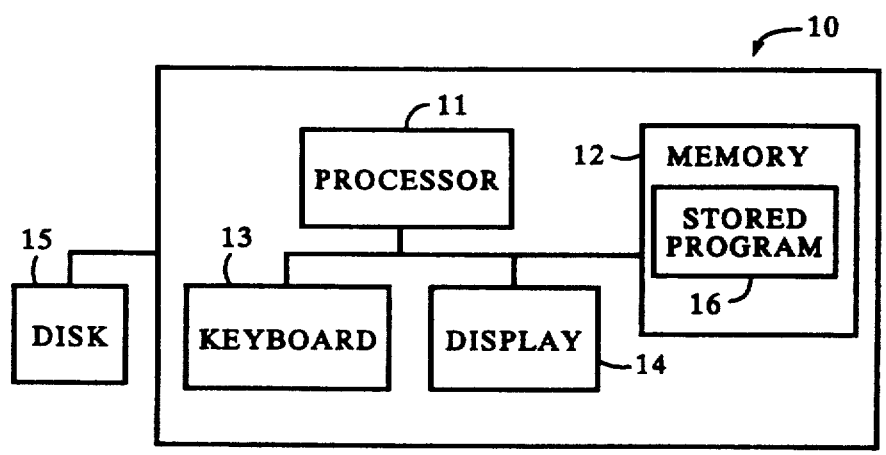
FIG. 2 shows a computer such as may be used to practice the invention.

The invention is conveniently practiced using a computer as shown in FIG. 2. Computer 10 includes processor 11, memory 12, entering means, such as keyboard 13, for entering data into the computer, and outputting means, such as display 14, for outputting data from the computer. Processor 11, memory 12, keyboard 13, and display 14 are constructed and interconnected as well known in the art. Disk 15 may provide alternative means for entering and outputting data. A program 16 stored in memory 12 provides with processor 11 calculating means for calculating certain data as will further described hereafter.

In practicing the invention, after expressing the timing requirements of an operation as a set D of dependences as described above, the set D is enters them into a dependence file in the memory 12 of computer 10. The dependences may be entered directly through keyboard 13, but it is usually more convenient to formulate the dependences and represent them in a dependence file on a disk and then enter the dependence file into the computer memory from the disk.

After the dependences have been entered a series of computations are made by the computer under control of the stored program. These computations are diagrammed in the flow diagrams of FIGS. 3-13.

Before taking up the computations in detail, it will be useful to consider the problem in the terminology of mathematical graphs. A graph in this sense is a set of vertexes connected by a set of edges. It is readily seen that a set of dependences as described above is isomorphic with such a graph: the transitions identified in the dependences corresponding to vertexes of the graph, and the association of transitions specified by a dependence corresponding to directed edges of the graph. An inconsistency means that there are two distinct paths between two vertexes of the corresponding graph, and these two paths imply disparate time relationships between the two vertexes. The two distinct paths between given vertexes may be considered as a loop, and it can be said that an inconsistency can only occur in association with a loop. A loop in the graph need not, however, give rise to an inconsistency since the alternate paths need not imply disparate time relationships. It is only non-zero loops which correspond to inconsistencies. (A non-zero loop being a loop in which the sum of the intervals in going around it, taking account of path direction and interval signs, is non-zero.)

Because inconsistencies are associated with loops, the central activity of the programmed computation is a search for loops and an evaluation of whether they are non-zero. Free ends of paths on the other hand have no loops and accordingly can give rise to no inconsistencies and may therefore be disregarded in a search for inconsistencies.

Figure 3:
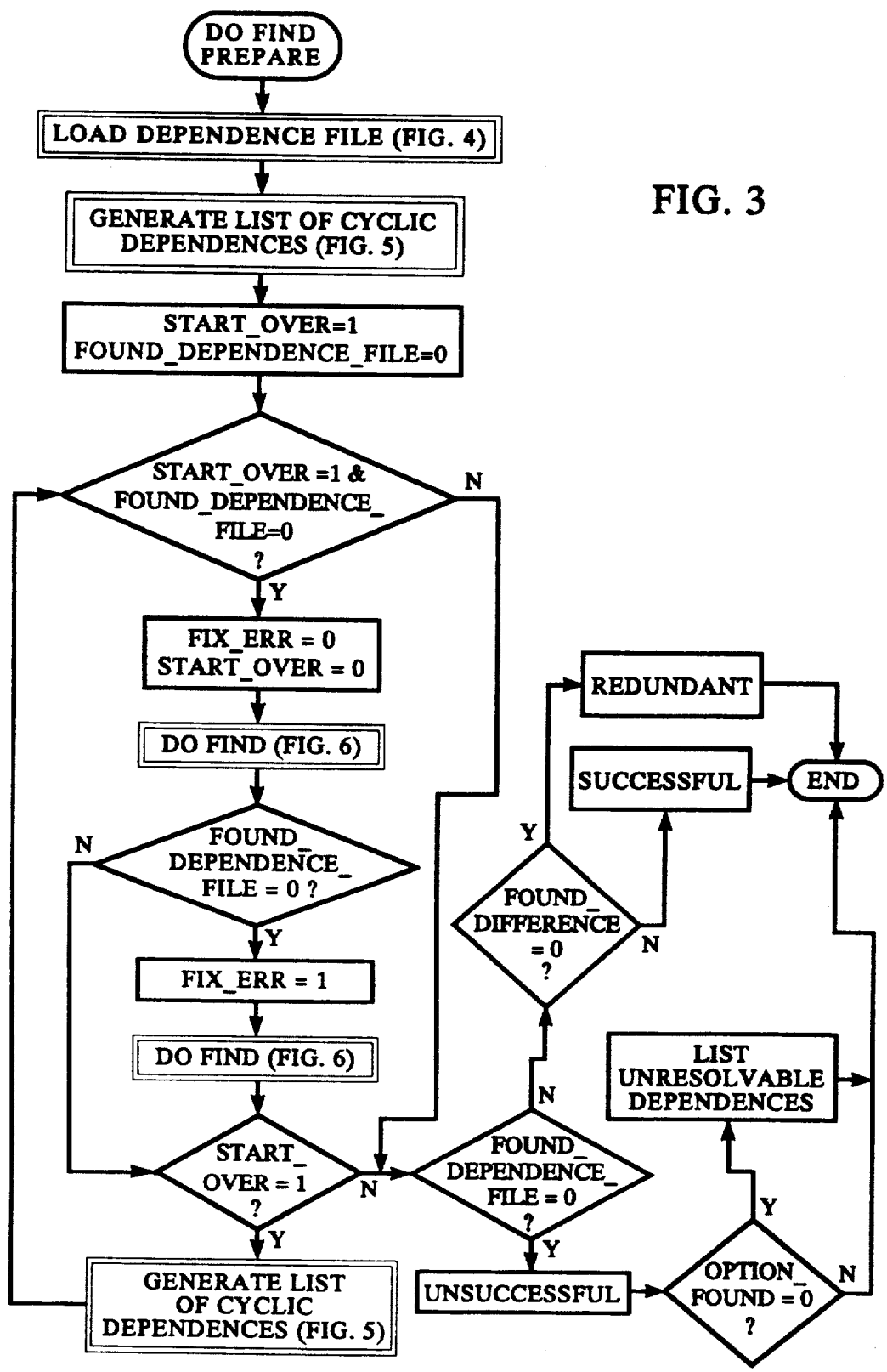
Figure 4:
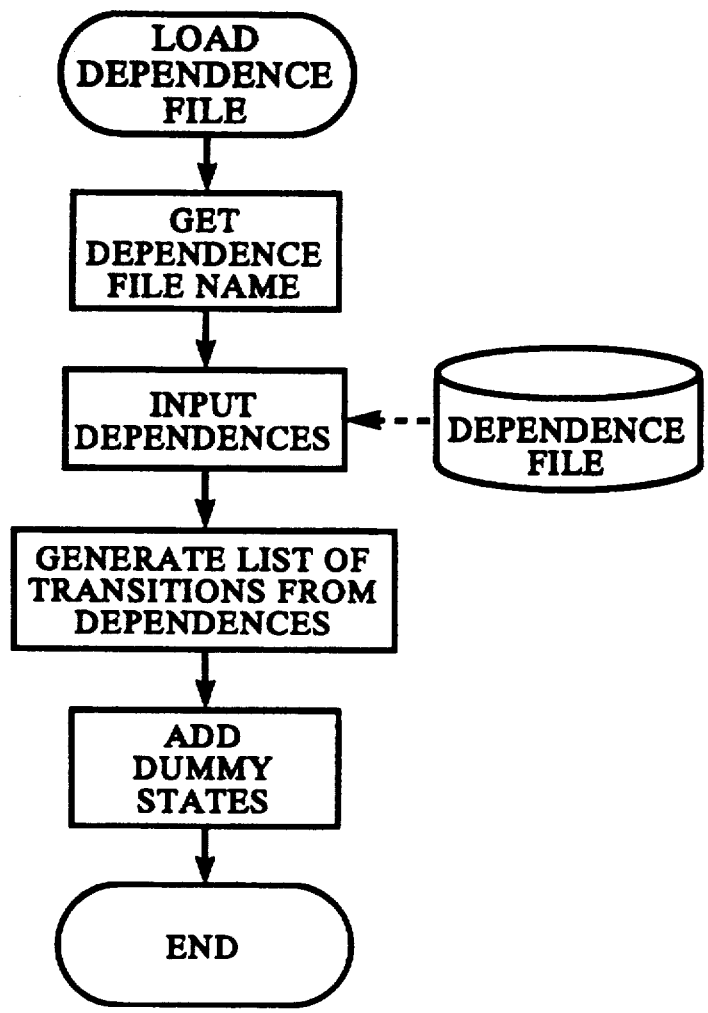
FIGS. 4, 5, 6, 7, 8, 9, 10, 11, 12 and 13 show the flow diagram of a program according to the invention.
Figure 5:
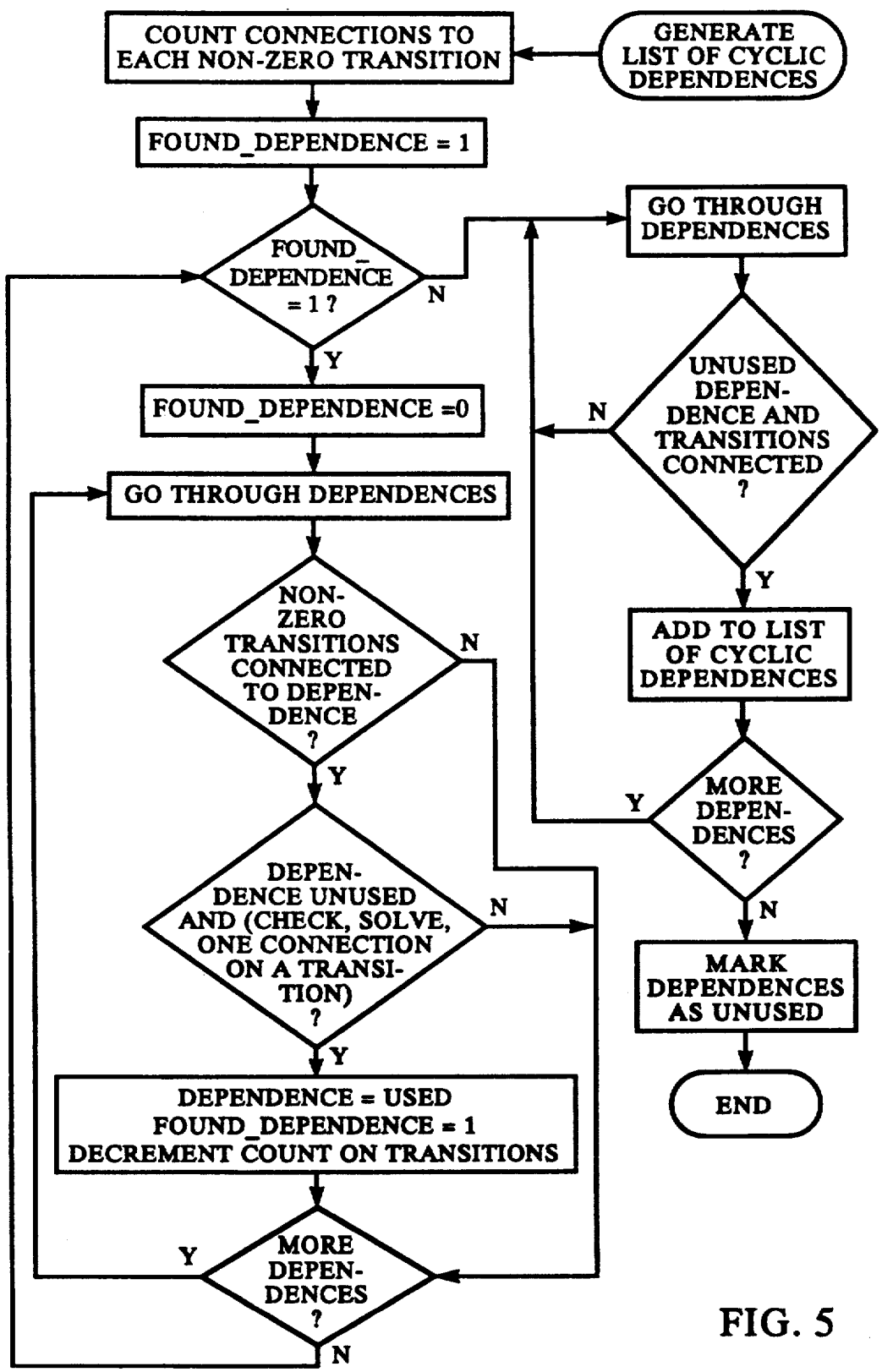
Figure 6:
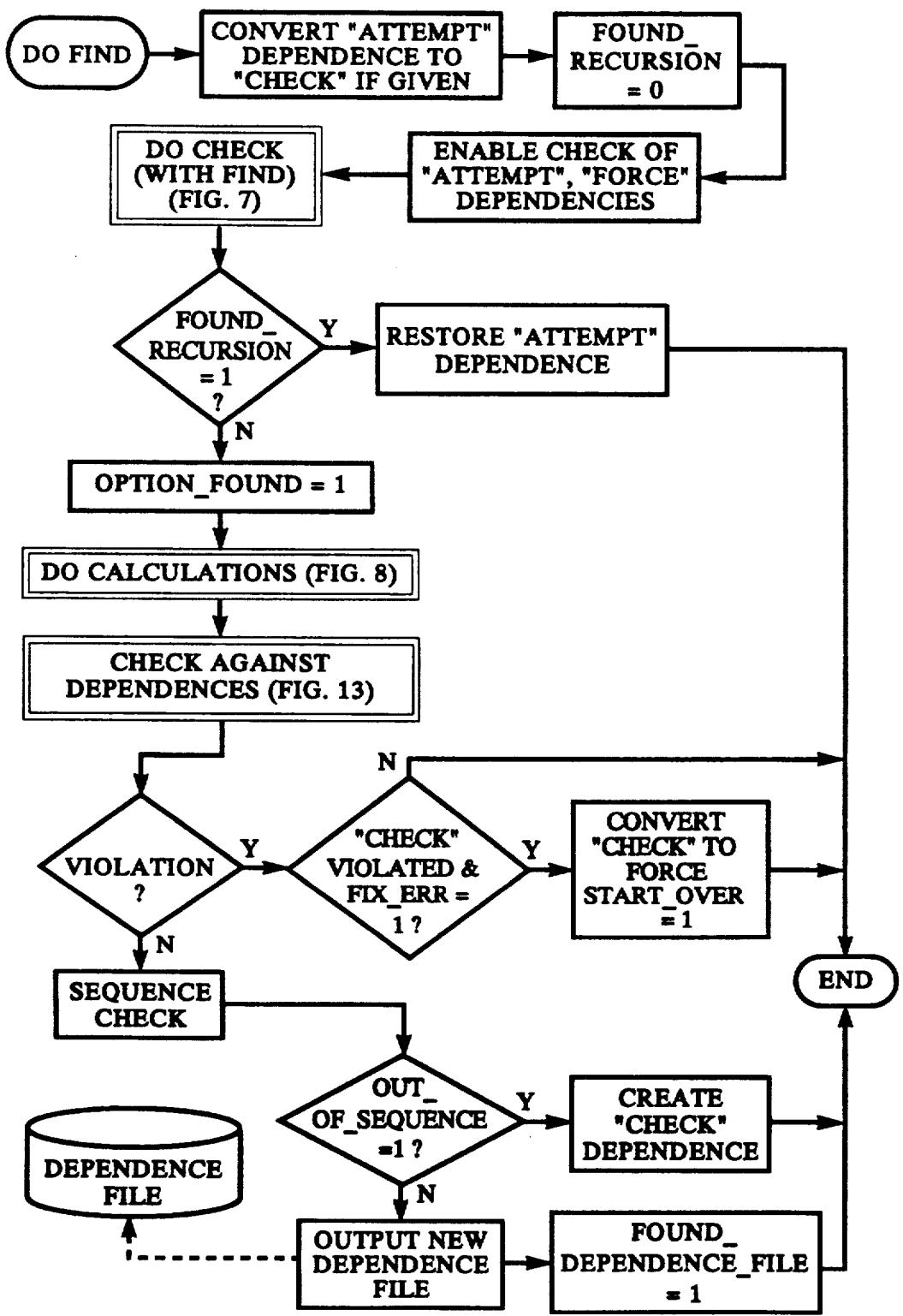
Figure 7:
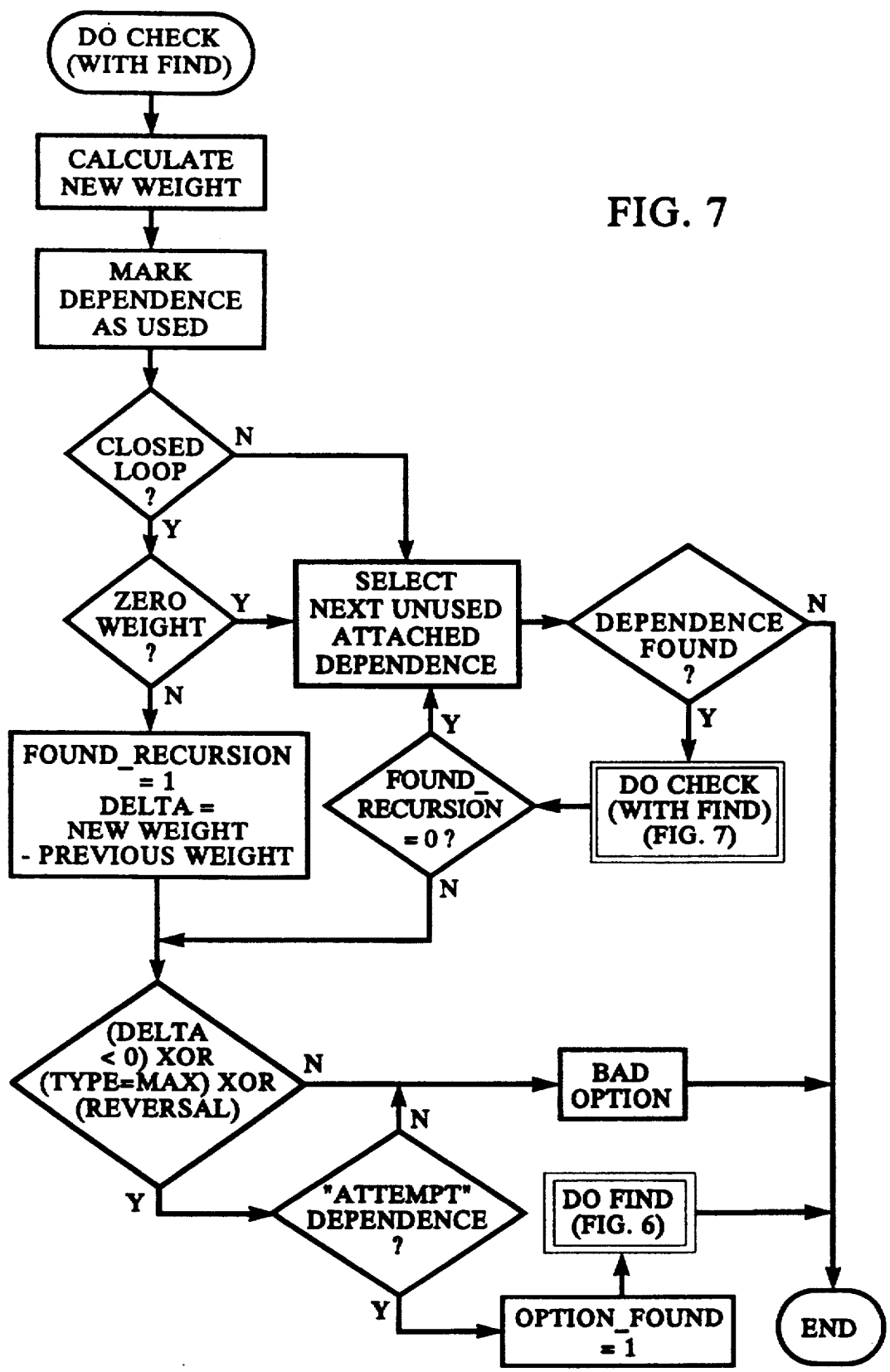
Figure 8:
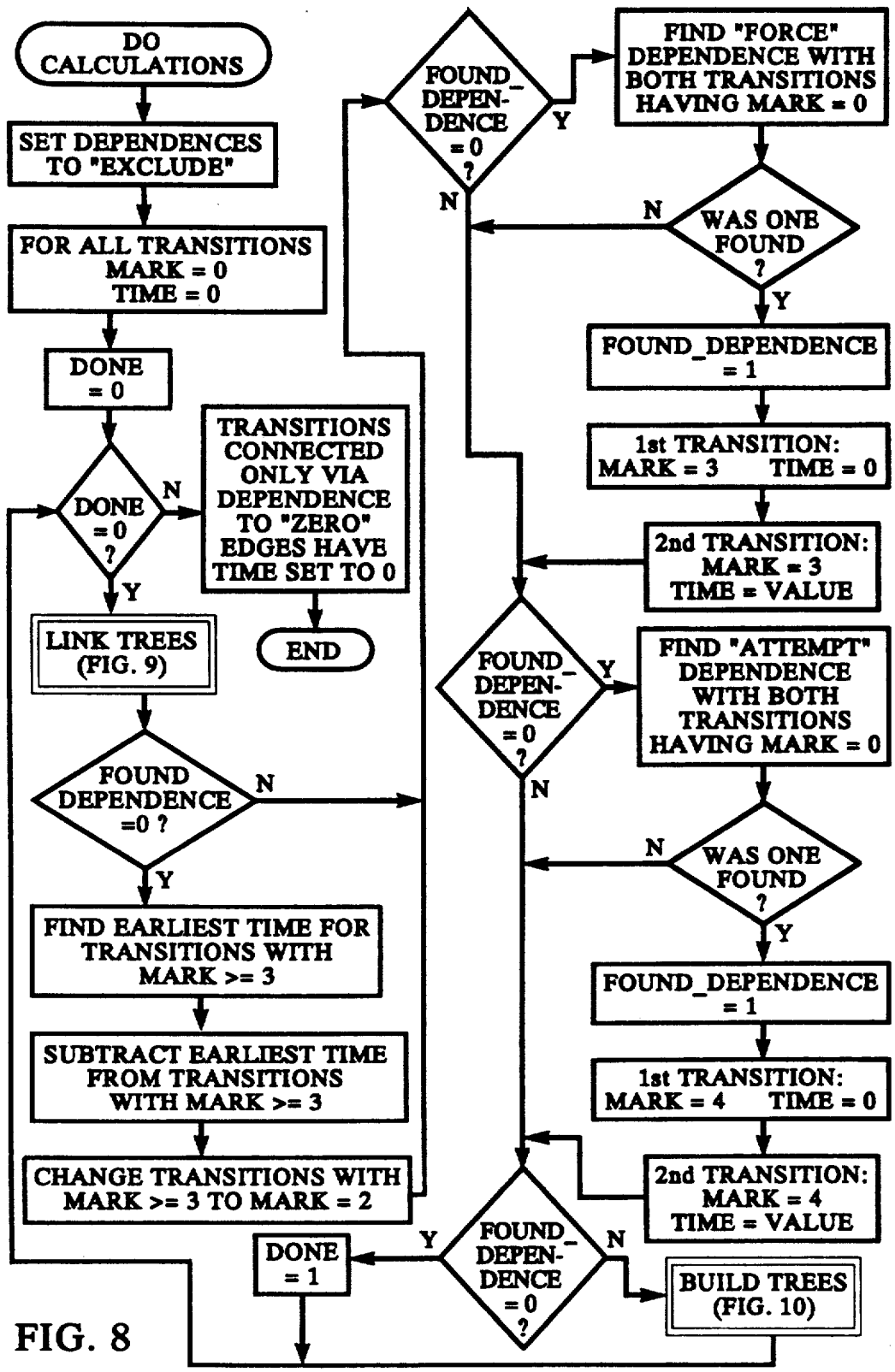
Figure 9:
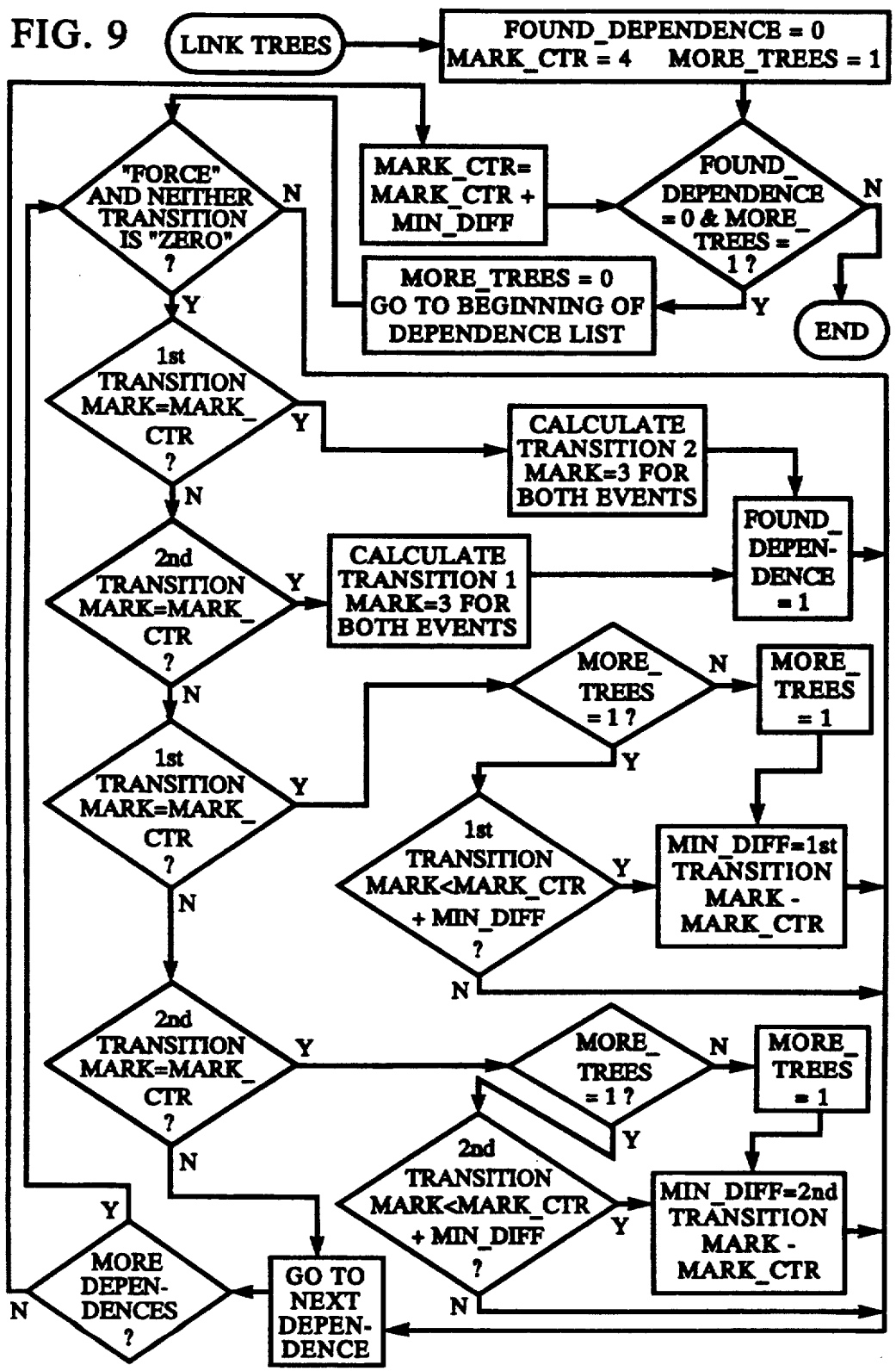
Figure 10:
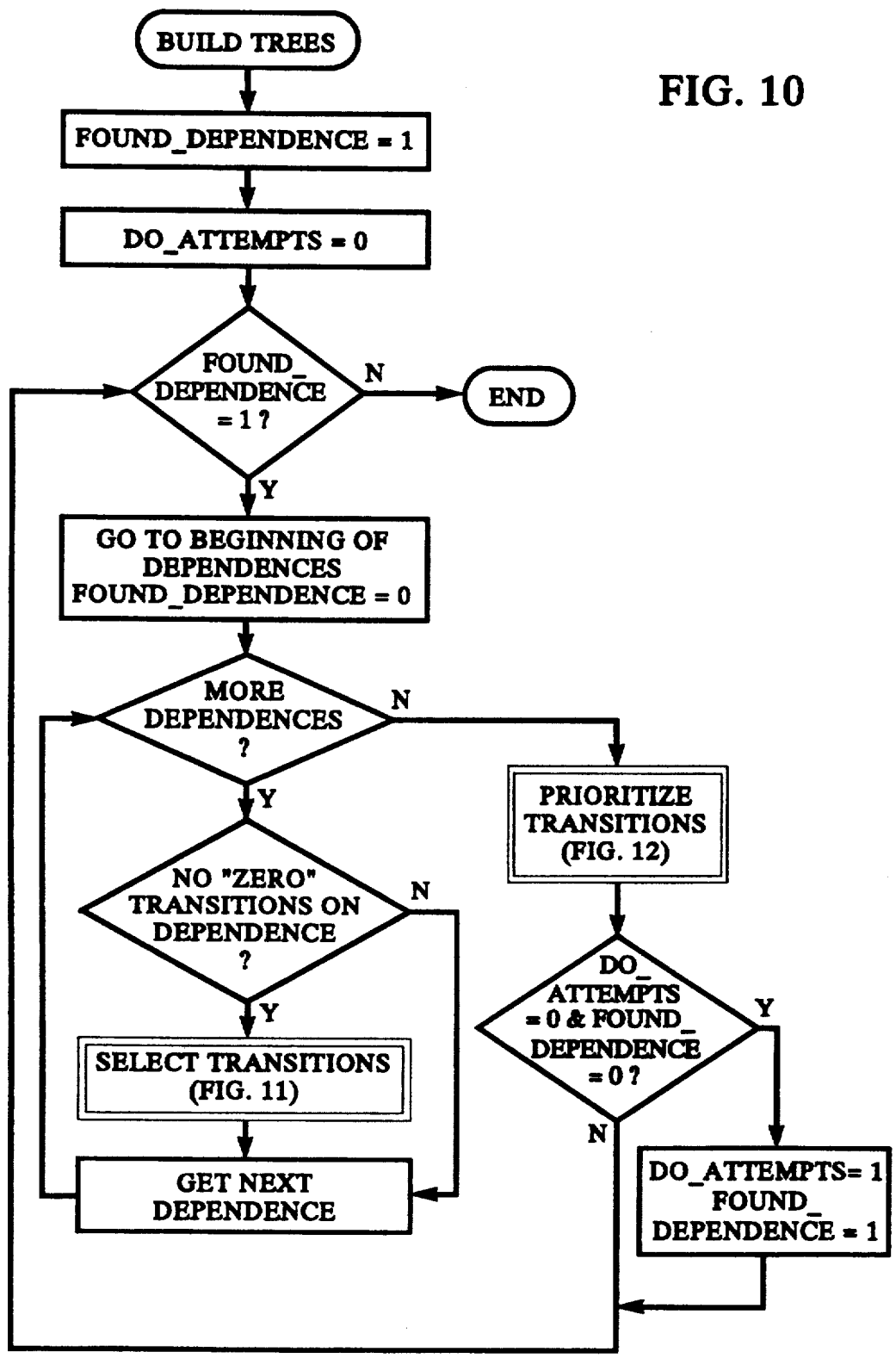
Figure 11:
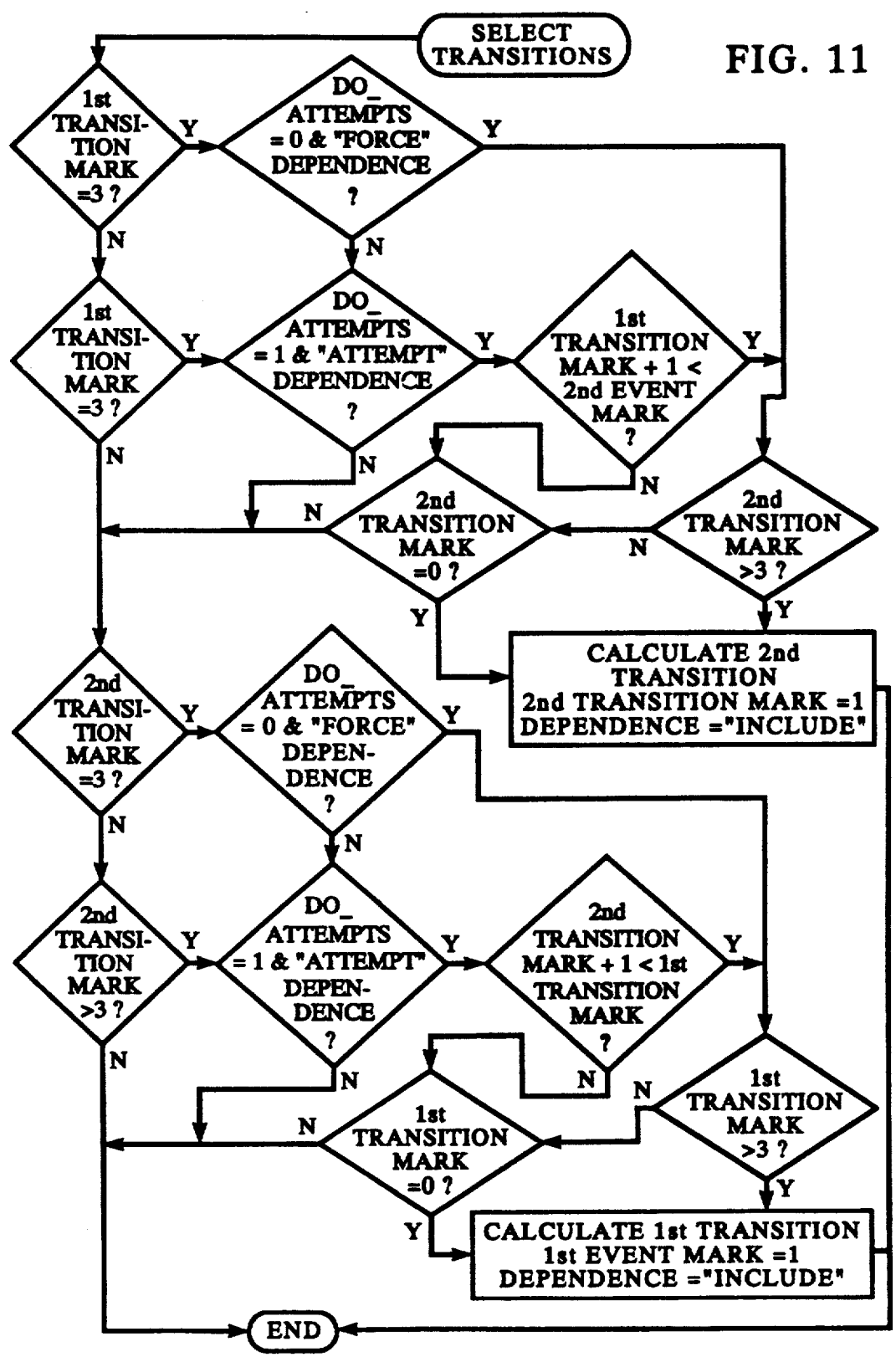
Figure 12:
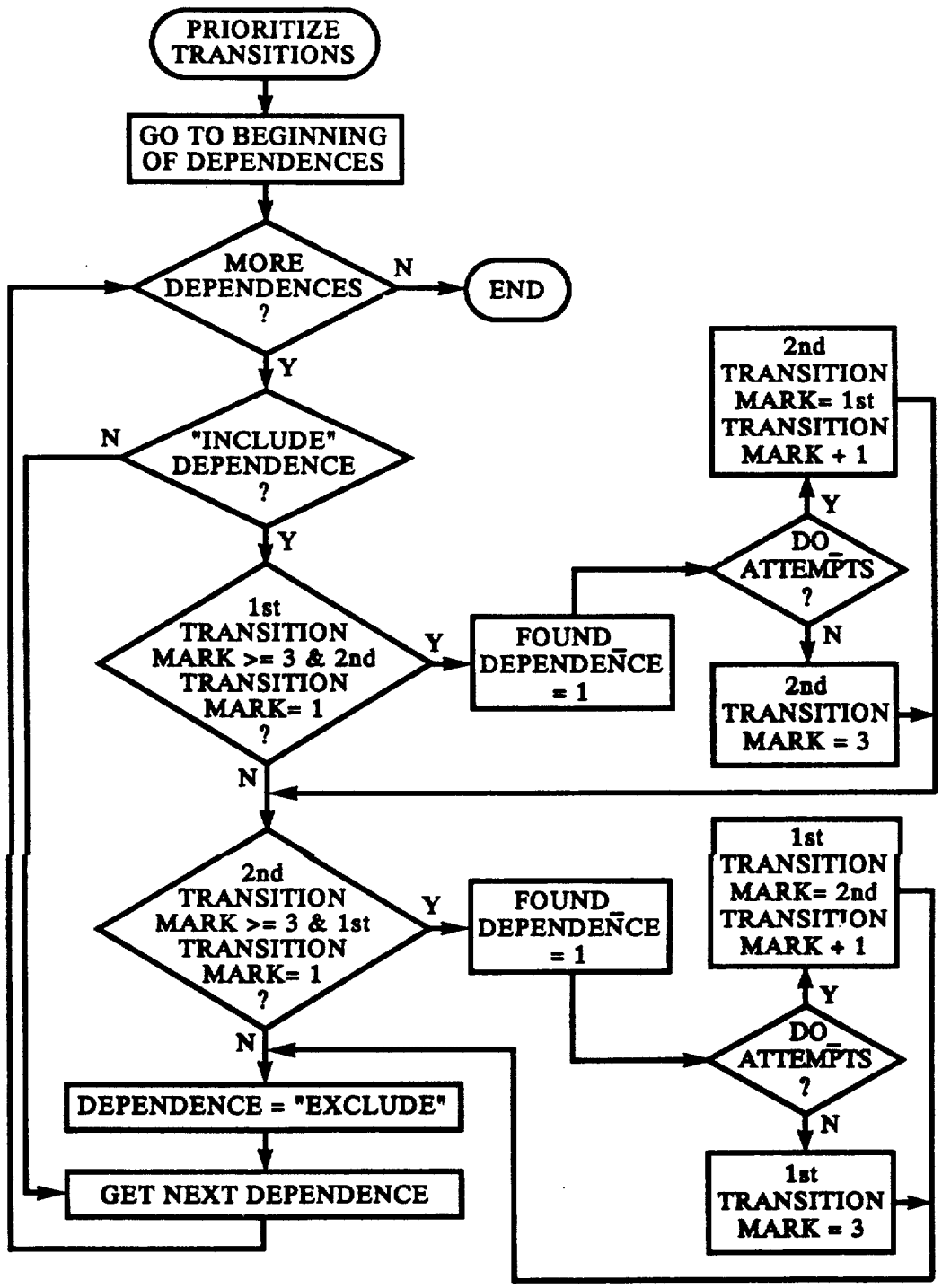
Figure 13:
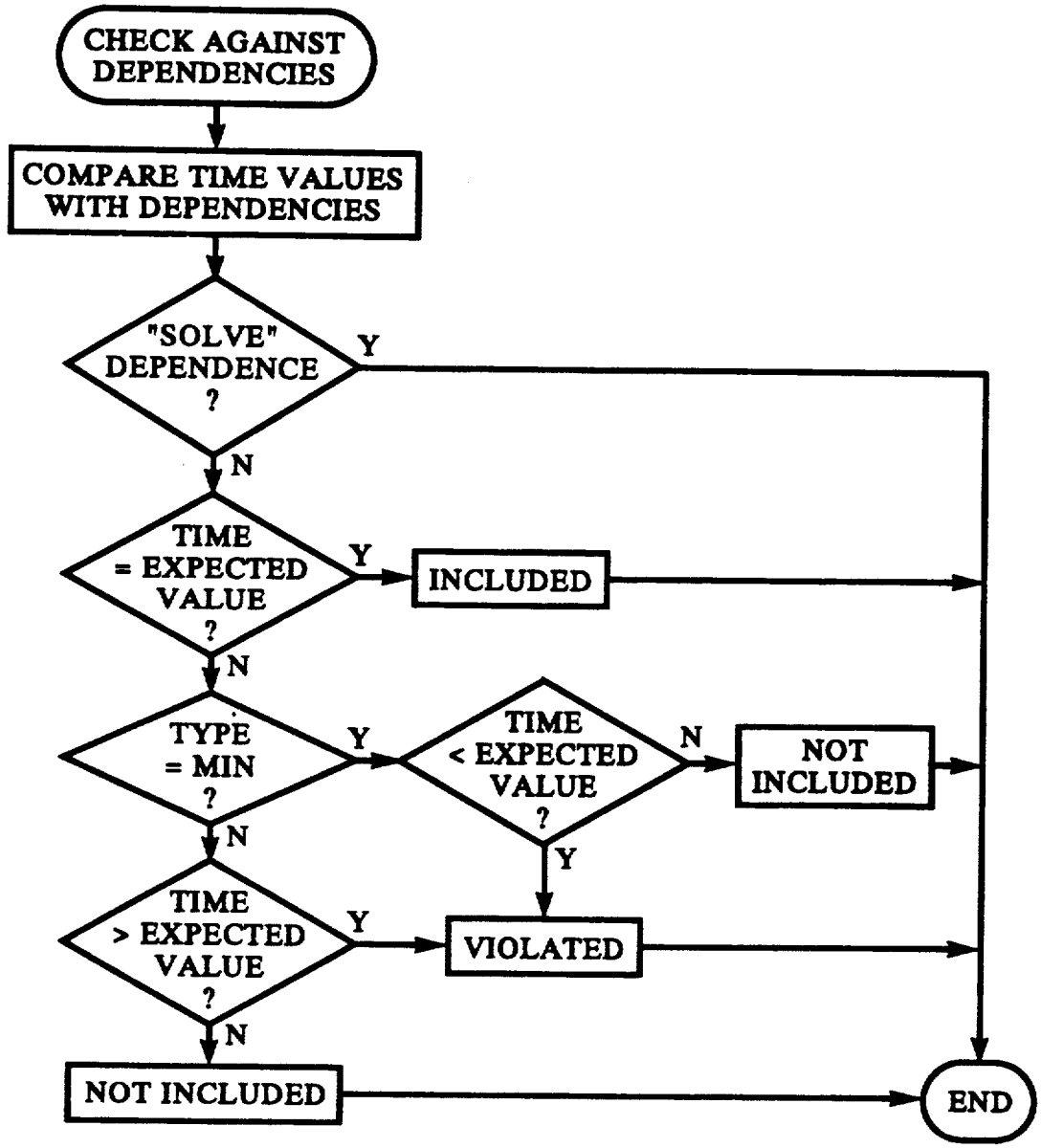

The program starts with "do find prepare" shown on FIG. 3, and works through "load dependence file" shown in detail in FIG. 4. The "generate list of cyclic dependences" (FIG. 5) effects the paring off of peripheral branching dependences and reduces the working set of dependences to those involved in loops. After these preliminaries, the program then enters the "do find" module (FIG. 6). It starts at an arbitrary point in the list of cyclic dependences and follows a wandering path along force and atempt dependences, keeping track of its path and assigning to each vertex it visits a time attribute consistent with the intervals of the path. When it arrives at a vertex (i.e.: transition) a second time it recognizes that it has found a loop. It evaluates the loop to ascertain if it is zero or non-zero. If the loop is found to be a zero loop, the program retraces its path to find a vertex from which it can branch off for further exploratory wandering. If the loop is found to be non-zero, the path is retraced and each dependence along the retraced path is evaluated to see if it is eligible for conversion to a CHECK class dependence. The condition for eligibility is that the dependence be of the ATTEMPT class, and that its interval and comparison parameter are compatible with the time difference between the assigned time attributes of its bounding transitions. Thus, the interval of an eligible dependence can be altered to bring the sum of the loop time intervals to zero.

On finding an eligible dependence, the program forms a revised set of dependences differing from the preceeding one in having the eligible dependence converted to a CHECK class dependence. Then through a recursive call the "do find" module is reentered and repeated on the revised set of dependences. The program thus proceeds to recursively enter the set of dependences, wander through it to locate a non-zero loop, and break the loop by relaxing an ATTEMPT dependence to a compatible CHECK dependence. At any recursive level the retracing of the path after finding a non-zero loop may return to the beginning of the loop without finding an eligible dependence. This indicates that the loop is not amenable to resolution by the relaxing process of the program and that no solution can be effected. The program reports this result and identifies the unresolvable loop.

Supposing no unresolvable loops are encountered, the program will eventually on some pass traverse all the dependences and assign times to all the transitions without looping. The state of the dependences and the assigned values of the transitions at this point represent a provisional solution. The program at this point checks all dependences to see if any are in violation of their comparison parameters. If any such are found, the last recursion level is reentered and alternative relaxations are explored, until either a solution without violations is found or all options are exhausted.

Finally the program checks all CHECK dependences to reconvert any which can be changed to ATTEMPT class.

Additional details of the program are shown in the flow diagrams.

What is claimed is:

1. Apparatus for detecting incompatibilities among related signals, the apparatus comprising:
   a. memory means for storing data representative of relationships among a plurality of signals, the data for each signal relationship including a comparison parameter, a time interval having magnitude and direction, a signal location and a priority level;
   b. output means for communicating with a user; and c. processor means for detecting incompatibilities among the signals characterized by the data, such means including
   i. means for identifying at least one group of signals characterized by locations and timing intervals that are related to one another as a loop;
   ii. means for determining whether the sum of the time intervals within the loop, taking account of interval directions, equals zero; and
   iii. means for causing the output means to report compatibility among the signals in each group in which the sum equals zero.

2. Apparatus for detecting incompatibilities among related signals, the apparatus comprising:
   a. memory means for storing data representative of relationships among a plurality of signals, the data for each signal relationship including a comparison parameter, a time interval having magnitude and direction, a signal location and a priority level;
   b. output means for communicating with a user; and
   c. processor means for detecting incompatibilities among the signals characterized by the data, such means including
      i. means for identifying at least one group of signals characterized by locations and timing intervals that are related to one another as a loop;
      ii. means for determining whether the sum of the time intervals within the loop, taking account of interval directions, equals zero;
      iii. means for causing the output means to report compatibility among the signals in each group in which the sum equals zero;
      v. means for searching for at least one signal relationship eligible for conversion to a lower priority level if said sum does not equal zero; and
      vi. means for altering the timing interval of each eligible signal relationship to bring said sum to zero.

3. The apparatus of claim 2 wherein a signal relationship is identified as eligible if the necessary alteration of its interval is not inconsistent with the comparison parameter, and its priority level is sufficiently low.

4. The apparatus of claim 3 wherein a signal relationship is identified as eligible if the boolean function of the form, as applied to the signal relationship, is true.

5. The apparatus of claim 3 wherein the processor means is further adapted to cause the output means to report the identity of each eligible signal relationship.

6. Apparatus for detecting incompatibilities among related signals, the apparatus comprising:
   a. first memory means for storing data representative of relationships among a plurality of signals, the data for each signal relationship including a comparison parameter, a time interval having magnitude and direction, two signal transitions and a priority level;
   b. second memory means for storing graphical signal-relationship data; and
   c. processor means for detecting incompatibilities among the signals characterized by the data stored in the first memory means, such means including
      i. means for constructing, in the second memory means, a graph representative of the data in the first memory means, the vertices of the graph corresponding to the signal transitions and the edges of the graph corresponding to and having values representative of the time intervals;
      ii. means for analyzing the data to identify loops within the graph;
      iii. means for calculating the sums of the edge values of each loop, taking account of interval directions;
      iv. means for identifying signal relationships eligible for conversion to a lower priority level;
      v. means for searching, in each loop in which the sum of the edge values is non-zero, for at least one signal relationship identified as eligible for conversion to a lower priority level so that its edge value may be altered to bring the sum of the edge values of the loop to zero; and
   d. output means for communicating each such signal relationship to a user.

7. The apparatus of claim 6 wherein loops are identified as the graph is constructed.

8. A method of detecting incompatibilities among related signals, the method comprising the steps of:
   a. electronically storing data representative of relationships among a plurality of signals, the data for each relationship including a comparison parameter, a time interval having magnitude and direction, a signal location and a priority level;
   b. processing the stored data to identify at least one group of signals characterized by locations and timing intervals that are related to one another as a loop;
   c. determining whether the sum of the time intervals within the loop, taking account of interval directions, equals zero; and
   d. if so, reporting that the signals within the loop are compatible.

9. The method of claim 8, further comprising the steps of searching, if said sum does not equal zero, for at least one signal relationship eligible for conversion to a lower priority level, and thereafter altering the timing interval of as many eligible signal relationships as necessary to bring said sum to zero.

10. The method of claim 9 wherein a signal relationship is identified as eligible if the necessary alteration of its interval is not inconsistent with the comparison parameter, and its priority level is sufficiently low.

11. The method of claim 10 wherein a signal relationship is identified as eligible if a boolean function of the form, as applied to the signal relationship, is true.

12. The method of claim 10 further comprising the step of reporting the identity of each eligible signal relationship.

13. A method of detecting incompatibilities among related signals, the method comprising the steps of:
   a. electronically storing data representative of relationships among a plurality of signals, the data for each signal relationship including a comparison parameter, a time interval having magnitude and direction, two signal transitions and a priority level;
   b. constructing an electronic representation of a graph exemplifying the data, the vertices of the graph corresponding to the transitions and the edges of the graph corresponding to and having values corresponding to the time intervals;
   c. identifying loops within the graph;
   d. calculating the sums of the edge values of each loop, taking account of interval directions;
   e. identifying signal relationships eligible for conversion to a lower priority level; and f. for each loop in which the sum of the edge values is non-zero, searching for at least one signal relationship identified as eligible for conversion to a lower priority level so that its edge value may be altered to bring the sum of the edge values of the loop to zero; and g. communicating each such signal relationship to a user.

14. The method of claim 13 wherein loops are identified as the graph is constructed.

* * * * *